United States Patent
Miura (10) Patent No.: US 8,952,237 B2
(45) Date of Patent: Feb. 10, 2015

(54) SOLAR BATTERY MODULE AND SOLAR POWER GENERATION SYSTEM

(71) Applicant: Mitsubishi Electric Corporation, Chiyoda-ku (JP)

(72) Inventor: Teruto Miura, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 24 days.

(21) Appl. No.: 13/965,760

(22) Filed: Aug. 13, 2013

(65) Prior Publication Data

US 2014/0216518 A1 Aug. 7, 2014

(30) Foreign Application Priority Data

Feb. 7, 2013 (JP) .................................. 2013-022375

(51) Int. Cl.
*H01L 31/042* (2014.01)
*G01R 31/40* (2014.01)
*H01L 31/048* (2014.01)

(52) U.S. Cl.
CPC .............. *H02S 50/00* (2013.01); *H01L 31/042* (2013.01); *H01L 31/048* (2013.01); *H01L 31/0487* (2013.01)
USPC ......................................... 136/244; 136/246

(58) Field of Classification Search
USPC ................................................ 136/244, 246
See application file for complete search history.

(56) References Cited

U.S. PATENT DOCUMENTS

| 8,153,884 B2 * | 4/2012 | Tsunomura et al. | 136/244 |
| 8,415,556 B2 * | 4/2013 | Singh et al. | 136/258 |
| 2009/0038675 A1 * | 2/2009 | Tsunomura et al. | 136/251 |
| 2010/0126554 A1 * | 5/2010 | Morgan et al. | 136/246 |
| 2010/0175755 A1 * | 7/2010 | Singh et al. | 136/258 |
| 2010/0252108 A1 * | 10/2010 | Singh et al. | 136/261 |
| 2011/0088744 A1 * | 4/2011 | Xia et al. | 136/244 |
| 2011/0127839 A1 | 6/2011 | Takano et al. | |
| 2013/0276876 A1 * | 10/2013 | Kerkar et al. | 136/256 |

FOREIGN PATENT DOCUMENTS

| JP | 2002-329879 A | 11/2002 |
| JP | 2012-094751 A | 5/2012 |
| JP | 2012-195322 A | 10/2012 |
| JP | 5073058 B2 | 11/2012 |

* cited by examiner

*Primary Examiner* — Golam Mowla (74) *Attorney, Agent, or Firm* — Buchanan Ingersoll & Rooney PC (57) ABSTRACT

There is provided a solar battery module including a plurality of solar batter cells arranged on a same plane with a predetermined gap area, a light-receiving-surface side protecting member and a rear-surface side protecting member sandwiching the solar battery cells therebetween, and an irreversible temperature indicator that is provided on an outer surface of a non-light-receiving surface side of the rear-surface side protecting member. The irreversible temperature indicator changes its color when a temperature rises to a predetermined color-changing temperature and maintains a color-changed status even when the temperature is decreased from the color-changing temperature to indicate a temperature rise to the predetermined color-changing temperature.

8 Claims, 7 Drawing Sheets

SOLAR BATTERY MODULE AND SOLAR POWER GENERATION SYSTEM

BACKGROUND OF THE INVENTION

1. Field of the Invention

The present invention relates to a solar battery module and a solar power generation system.

2. Description of the Related Art

In a large-scale solar power generation system such as a mega solar system, a large number of solar battery modules are connected in series or in parallel to obtain desired power as a system. In a solar battery module, a large number of solar battery cells are connected in series or in parallel to obtain desired power as a module.

However, when there is an abnormality in solar battery cells constituting the module or a disconnection of a solder-plated copper wire that connects the solar battery cells in series in the solar battery module, the module output of a line of solar battery modules connected in series may be decreased. In this case, although it is desirable to change the solar battery module having the abnormality, it is often difficult to visually confirm which solar battery module has the abnormality, depending on the type of the abnormality. This requires checking of all suspicious solar battery modules, and this causes a heavy burden on operations and costs.

Japanese Patent Application Laid-open No. 2012-195322 discloses a method in which a solar-battery-module abnormality monitoring unit detects a change of an output voltage to determine whether there is an abnormality in a solar battery module. However, this method requires an instrument to measure the output voltage. Therefore, there has been desired a method of confirming a solar battery module having an abnormality easily and inexpensively.

SUMMARY OF THE INVENTION

It is an object of the present invention to at least partially solve the problems in the conventional technology.

There is provided a solar battery module including: a plurality of solar batter cells arranged on a same plane with a predetermined gap area; a light-receiving-surface side protecting member and a rear-surface side protecting member sandwiching the solar battery cells therebetween; and an irreversible temperature indicator that is provided on an outer surface of a non-light-receiving surface side of the rear-surface side protecting member, wherein the irreversible temperature indicator changes its color when a temperature rises to a predetermined color-changing temperature and maintains a color-changed status even when the temperature is decreased from the color-changing temperature to indicate a temperature rise to the predetermined color-changing temperature.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a solar battery module and a solar power generation system according to the present invention will be explained below in detail with reference to the accompanying drawings. The present invention is not limited to the following descriptions and can be modified as appropriate without departing from the scope of the invention. In the drawings explained below, for easier understanding, scales of respective members may be different from those of actual products. The same holds true for the relationships between respective drawings. Furthermore, even if the drawings are plan views, hatchings may be added for clearer viewing of the drawings.

First Embodiment

Figure 1A:
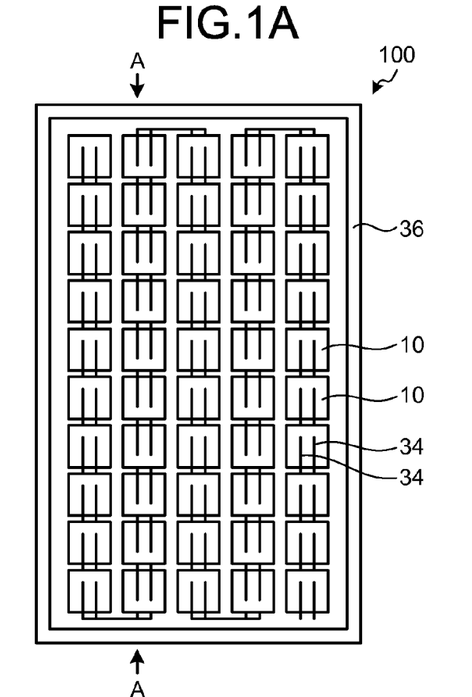
FIG. 1A is a plan view of a solar battery module according to a first embodiment of the present invention as viewed from a light-receiving surface side.
Figure 1B:
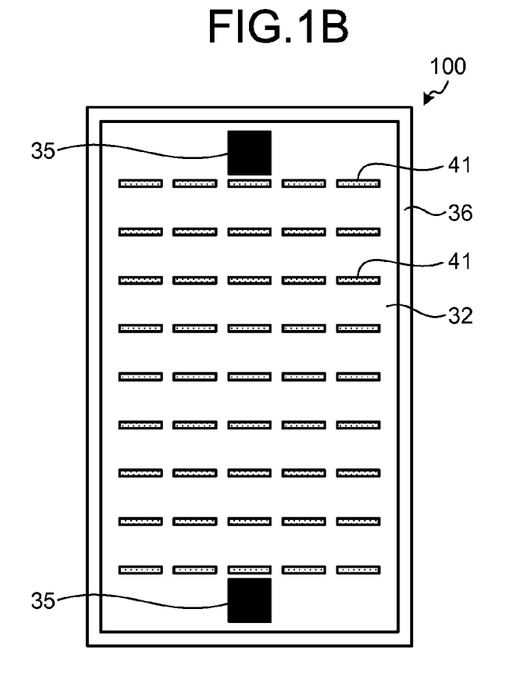
FIG. 1B is a plan view of the solar battery module according to the first embodiment as viewed from a non-light-receiving surface side (a rear surface side)
Figure 1C:
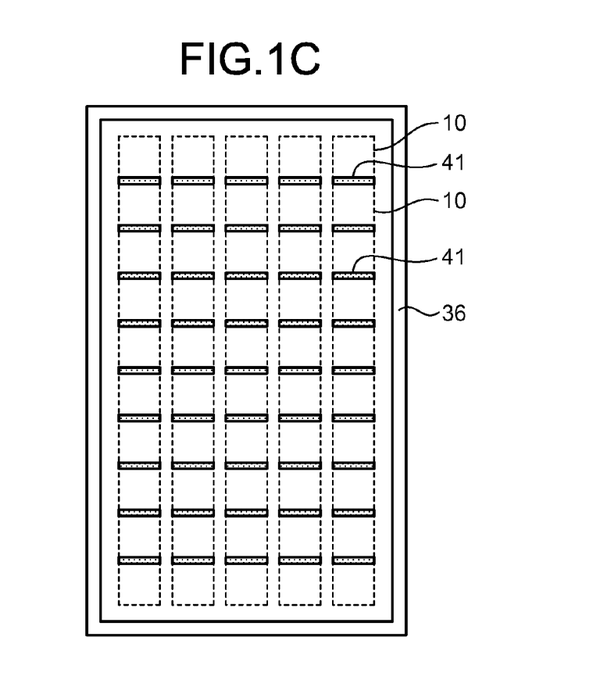
FIG. 1C is a perspective view of the solar battery module according to the first embodiment focused on positions of an irreversible temperature indicator and a solar battery cell as viewed from the non-light-receiving surface side (the rear surface side) through a rear-surface side protecting member.
Figure 1D:
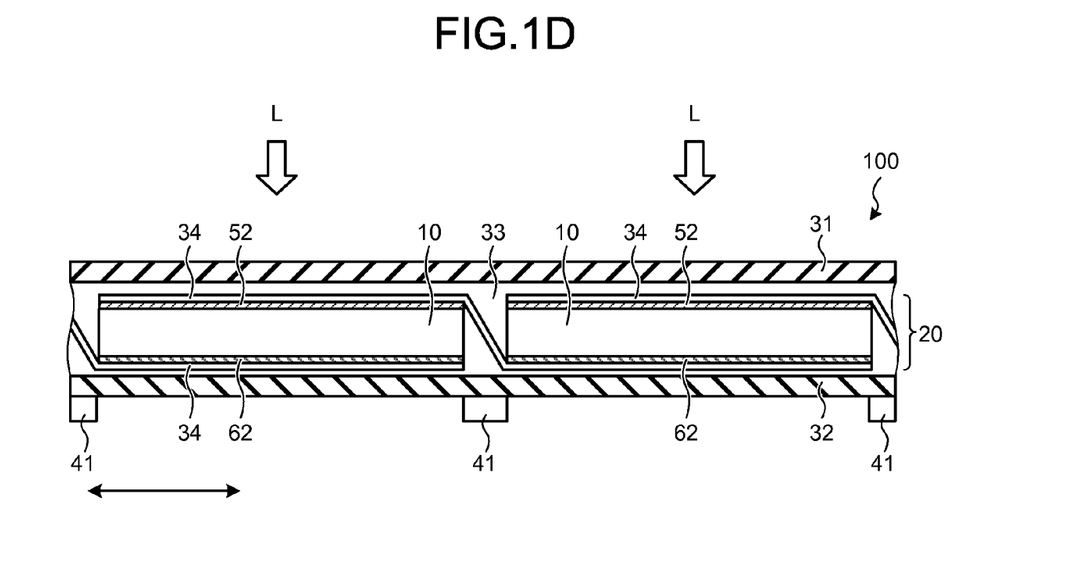
FIG. 1D is a cross-sectional view of relevant parts of the solar battery module according to the first embodiment, and is a cross-sectional view cut along a line A-A shown in FIG. 1A.

FIG. 1A is a plan view of a solar battery module 100 according to a first embodiment of the present invention as viewed from a light-receiving surface side. FIG. 1B is a plan view of the solar battery module 100 according to the first embodiment as viewed from a non-light-receiving surface side (a rear surface side). FIG. 1C is a perspective view of the solar battery module 100 according to the first embodiment focused on positions of an irreversible temperature indicator 41 and a solar battery cell 10 as viewed from the non-light-receiving surface side (the rear surface side) through a rear-surface side protecting member 32. FIG. 1D is a cross-sectional view of relevant parts of the solar battery module 100 according to the first embodiment, and is a cross-sectional view cut along a line A-A shown in FIG. 1A.

The solar battery module 100 according to the first embodiment includes a solar battery string 20 in which a plurality of crystal solar battery cells 10 (hereinafter, "solar battery cells 10") are electrically connected in series in a wired manner by a connection wire 34, a light-receiving-surface side protecting member 31, the rear-surface side protecting member 32, and a sealing member 33. The solar battery string 20 is sealed in the sealing member 33 that is sandwiched between the light-receiving-surface side protecting member 31 arranged on a front surface side (a light-receiving surface side) of the solar battery module 100 and the rear-surface side protecting member 32 arranged on an opposite side (a rear surface side) of the light-receiving surface of the solar battery module 100. In the solar battery module 100 having this configuration, light L is incident from a side of the light-receiving-surface side protecting member 31. Furthermore, a frame 36 is arranged on a circumferential portion of the solar battery module 100.

The light-receiving-surface side protecting member 31 is made of a material that is translucent to light, and is arranged on the light-receiving surface side that receives solar light to protect the light-receiving surface side of the solar battery string 20. For example, glass or translucent plastic is used as the material of the light-receiving-surface side protecting member 31. The rear-surface side protecting member 32 is arranged on the non-light-receiving surface side (the rear surface side), which is the opposite side of the light-receiving surface of the solar battery string 20, to protect the rear surface side of the solar battery string 20. For example, a translucent film such as polyethylene terephthalate (PET) or a laminated film sandwiching an aluminum (Al) foil is used as a material of the rear-surface side protecting member 32. Transparency is not particularly essential in the rear-surface side protecting member 32.

The sealing member 33 is provided between the solar battery string 20 and the light-receiving-surface side protecting member 31 and between the solar battery string 20 and the rear-surface side protecting member 32. For example, translucent resin such as ethylene-vinyl acetate (EVA), silicon, or urethane is used as the material of the sealing member 33.

A configuration of the solar battery string 20 is explained next. The solar battery string 20 includes the solar battery cells 10 arranged in a predetermined arrangement direction and the connection wires 34. The solar battery cells 10 are regularly arranged on the substantially same plane while being separated by a predetermined distance in the predetermined arrangement direction. Two adjacent solar battery cells 10 are electrically connected to each other in series by the connection wires 34. In the first embodiment, ten solar battery cells 10 are electrically connected in series to constitute the solar battery string 20, and five solar battery strings 20 are further electrically connected in series to constitute one long solar battery string.

Figure 2A:
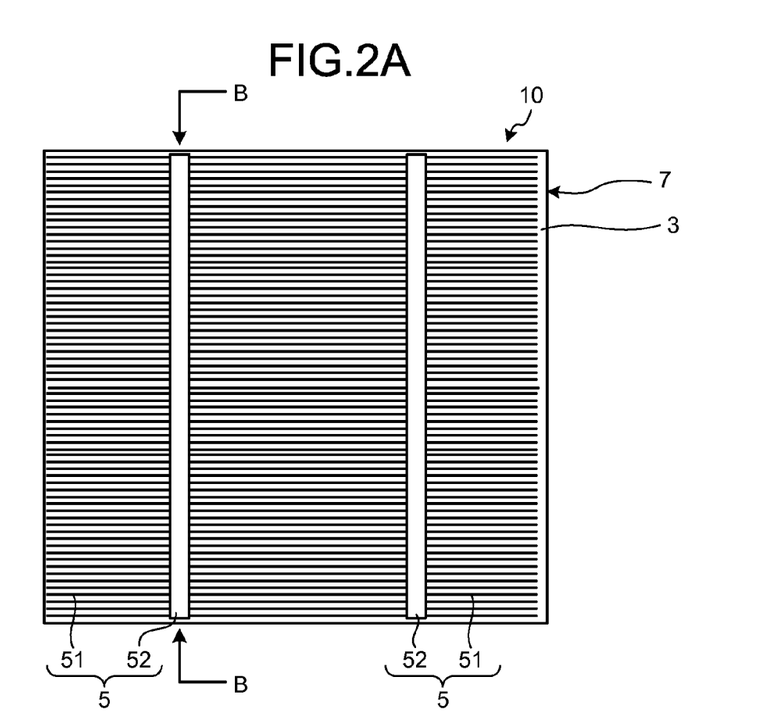
FIG. 2A is a plan view of the solar battery cell according to the first embodiment as viewed from the light-receiving surface side.
Figure 2B:
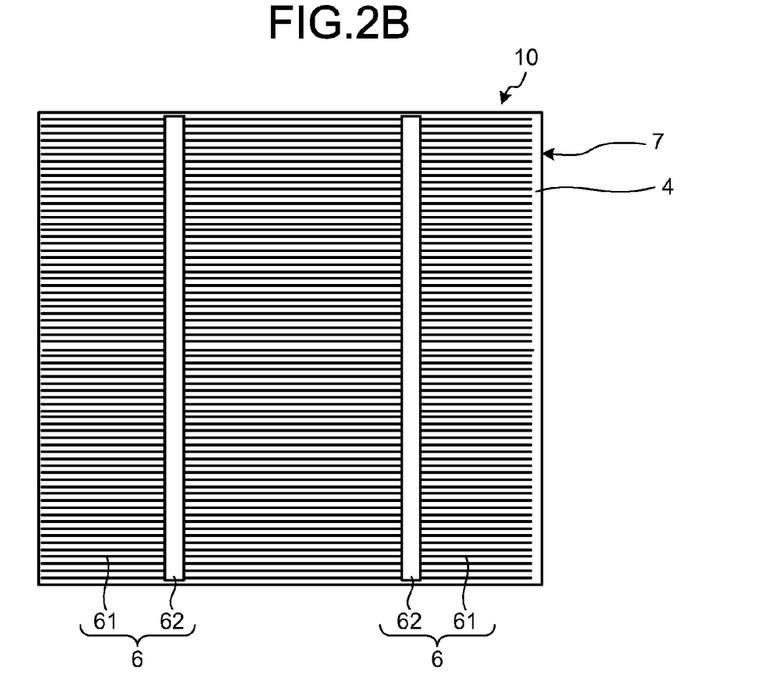
FIG. 2B is a plan view of the solar battery cell according to the first embodiment as viewed from the non-light-receiving surface side (the rear surface side)
Figure 2C:
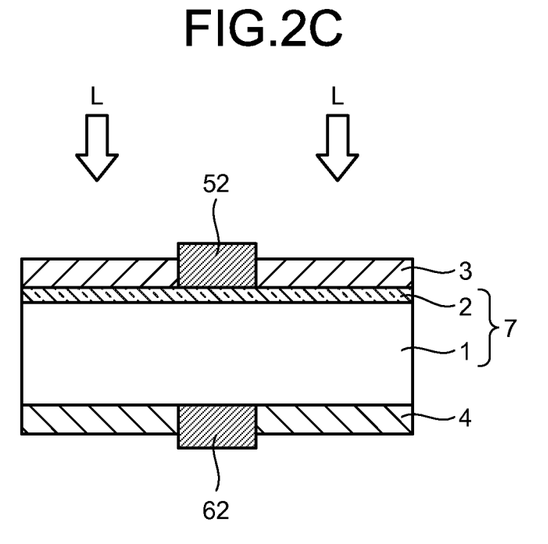
FIG. 2C is a cross-sectional view of relevant parts of the solar battery cell according to the first embodiment, and is a cross-sectional view cut along a line B-B shown in FIG. 2A.

A configuration of the solar battery cell 10 is explained next. FIG. 2A is a plan view of the solar battery cell 10 according to the first embodiment as viewed from the light-receiving surface side. FIG. 2B is a plan view of the solar battery cell 10 according to the first embodiment as viewed from the non-light-receiving surface side (the rear surface side). FIG. 2C is a cross-sectional view of relevant parts of the solar battery cell 10 according to the first embodiment, and is a cross-sectional view cut along a line B-B shown in FIG. 2A.

As the solar battery cell 10, a crystal solar battery cell of a single-side power generation type, which is a representative example of a super straight type solar cell, can be used. In the solar battery cell 10, an antireflection film 3 made of, for example, a silicon nitride film is formed on the light-receiving surface side of a semiconductor substrate 7 including a p-n junction, the semiconductor substrate 7 being a solar battery substrate having a photoelectric conversion function. In the semiconductor substrate 7, an impurity diffused layer (an n-type impurity diffused layer) 2 is formed on the light-receiving surface side of a semiconductor substrate 1 by a phosphorous diffusion. The semiconductor substrate 1 is made of, for example, a p-type silicon. On the light-receiving surface side and the rear surface side of the semiconductor substrate 7, a light-receiving-surface bus electrode 52 and a rear-surface bus electrode 62 are respectively formed as connection electrodes for connecting the connection wire 34. In the solar battery cell 10 having this configuration, the light L is incident from a side of the antireflection film 3.

On the light-receiving surface side of the semiconductor substrate 7, light-receiving surface electrodes 5 having a comb shape made of a fired electrode material including silver and glass are provided while being electrically connected to the impurity diffused layer (the n-type impurity diffused layer) 2 through the antireflection film 3. As the light-receiving surface electrode 5, a plurality of thin and elongated light-receiving-surface grid electrodes 51 that collect photogenerated carriers from the semiconductor substrate 7 is provided while being arranged in an in-plane direction of the light-receiving surface of the semiconductor substrate 7. Furthermore, the light-receiving-surface bus electrode 52 that is conducted to the light-receiving-surface grid electrodes 51 and collects photogenerated carriers from the light-receiving-surface grid electrodes 51 is provided in a direction substantially perpendicular to the light-receiving-surface grid electrodes 51 in the in-plane direction of the light-receiving surface of the semiconductor substrate 7. The light-receiving-surface grid electrodes 51 and the light-receiving-surface bus electrode 52 are electrically connected to the impurity diffused layer 2 at their bottom surface portions.

An electrode width of each of the light-receiving-surface grid electrodes 51 is set, for example, as narrow as a few tens of micrometers, in order to increase a light receiving area of the semiconductor substrate 7. An electrode width of the light-receiving-surface bus electrode 52 is, for example, about 1 to 2 millimeters.

On the other hand, on the non-light-receiving surface side (the rear surface side) of the semiconductor substrate 7, a rear-surface insulating film 4 that is an insulating film is entirely provided. By providing the rear-surface insulating film 4 on the rear surface of the semiconductor substrate 7, it is possible to deactivate defects of the rear surface of the silicon substrate. A silicon nitride film or a silicon oxide film is used as the rear-surface insulating film 4.

Furthermore, on the non-light-receiving surface side (the rear surface side) of the semiconductor substrate 7, rear-surface electrodes 6 having a comb shape made of a fired electrode material including glass and silver or aluminum are provided while being electrically connected to the semiconductor substrate 1 through the rear-surface insulating film 4. Similarly to the light-receiving surface electrode 5, as the rear surface electrode 6, a plurality of thin and elongated rear-surface grid electrodes 61 that collect photogenerated carriers from the semiconductor substrate 7 are provided while being arranged in an in-plane direction of the non-light-receiving surface (the rear surface) of the semiconductor substrate 7. Further, the rear-surface bus electrodes 62 that are conducted to the rear-surface grid electrodes 61 and collect photogenerated carriers from the rear-surface grid electrodes 61 are provided in a direction substantially perpendicular to the rear-surface grid electrodes 61 in the in-plane direction of the non-light-receiving surface (the rear surface) of the semiconductor substrate 7. The rear-surface grid electrodes 61 and the rear-surface bus electrodes 62 are electrically connected to the semiconductor substrate 7 at their bottom surface portions. The rear-surface grid electrodes 61 are made of a fired electrode material including aluminum and glass, and the rear-surface bus electrodes 62 are made of a fired electrode material including silver and glass (fired electrode).

The connection wire 34 is made of an electrically-conductive material. The connection wire is bonded by soldering to the light-receiving-surface bus electrode 52 formed on the light-receiving surface of one solar battery cell 10 and the rear-surface bus electrode 62 formed on the rear surface of an adjacent solar battery cell 10, electrically connecting two adjacent solar battery cells 10 in series. For example, a solder-plated copper wire (a tabbing wire) obtained by plating a solder on copper or an electrically-conductive member such as copper can be used as the connection wire 34.

On a surface (outer surface) of the non-light-receiving surface side of the rear-surface side protecting member 32, output extraction units (terminal boxes) 35 for extracting power of the solar battery module 100 are provided. As the output extraction unit 35, two output extraction units 35 are arranged on the surface (outer surface) of the non-light-receiving surface side of the rear-surface side protecting member 32, including the output extraction unit (the terminal box) 35 connected to the light-receiving-surface bus electrode 52 of one solar battery cell 10 among two solar battery cells 10 on both sides in the solar battery string 20, and the output extraction unit (the terminal box) 35 connected to the rear-surface bus electrode 62 of the other solar battery cell 10 among the two solar battery cells 10.

A bypass diode (not shown) for bypassing only a specific solar battery module 100 when the specific solar battery module 100 is disabled to flow a current in a solar power generation system configured by connecting a plurality of solar battery modules 100 in series or in parallel are provided in the output extraction unit.

In the solar battery module 100 according to the first embodiment, the irreversible temperature indicator 41 that changes its color at a temperature of, for example, 150° C. is arranged in an area corresponding to an inter-cell area (gap area) between two adjacent solar battery cells 10 in a direction of series connecting the solar battery cells 10 in the solar battery string 20 on the surface (outer surface) of the non-light-receiving surface side of the rear-surface side protecting member 32. The irreversible temperature indicator 41 is made of a material that changes its color when its temperature reaches a specific temperature and that does not return to the original color even when the temperature is decreased, thereby enabling a confirmation of a temperature history. That is, the irreversible temperature indicator 41 changes its color in response to a temperature rise to a predetermined color-changing temperature and maintains the color-changed status even when the temperature is decreased from the predetermined color-changing temperature to a normal temperature, thereby indicating a temperature rise history to the predetermined color-changing temperature.

In the solar battery module 100, the connection wire 34 that is electrically wire-bonded to the light-receiving-surface bus electrode 52 of one solar battery cell 10 and the rear-surface bus electrode 62 of the other solar battery cell 10 in series is arranged between two adjacent solar battery cells 10 in the direction series connecting the solar battery cells 10 in the solar battery string 20. In order to electrically connect the light-receiving-surface bus electrode 52 of one solar battery cell 10 and the rear-surface bus electrode 62 of the other solar battery cell 10, the connection wire 34 is bent in a thickness direction of the solar battery cell 10 in an inter-cell area between two solar battery cells 10, thereby being wired across the inter-cell area (gap area).

When the solar battery module 100 is used for a long time, there may be a defect due to a disconnection of the connection wire 34 caused by a temporal degradation due to a temperature fluctuation. That is, because the solar battery module 100 is usually installed outdoors, the temperature of the solar battery module 100 is changed circularly, so that the connection wire 34 is constantly extended and shrunk repeatedly. Particularly, this may cause metallic fatigue of the connection wire 34 that is bent and arranged in an inter-cell area between the solar battery cells 10, and as a result, the connection wire 34 may be eventually disconnected.

The present inventor has found out that, based on his studies, when a defect occurs due to a disconnection of the connection wire 34, the resistance of the connection wire 34 is increased right before the disconnection of the connection wire 34, so that the temperature is increased up to about 150° C. due to heating of the connection wire 34. For example, when the connection wire 34 is made of copper, the temperature of the connection wire 34 is increased up to about 150° C. due to the temperature rise at the time of the disconnection.

In the solar battery module 100, the irreversible temperature indicators 41 that each change their color at a temperature of, for example, 150° C. are arranged on the surface (outer surface) of the non-light-receiving surface side of the rear-surface side protecting member 32 in the areas corresponding to inter-cell areas where the connection wires 34 are arranged while being bent. When there is a disconnection of the connection wire 34 arranged while being bent in the inter-cell area, the temperature of the irreversible temperature indicator 41 is increased due to the temperature rise at the time of the disconnection up to the color-changing temperature of the irreversible temperature indicator 41. For example, when the irreversible temperature indicator 41 is made of copper, the temperature is increased to about 150° C. and the color of the irreversible temperature indicator 41 changes. Therefore, by confirming the change of the color of the irreversible temperature indicators 41, it is possible to easily and surely confirm the location of the abnormality in the solar battery module 100 visually from outside. Furthermore, because the abnormality of the solar battery module 100 can be visually confirmed from outside, a burden on operations and costs is considerably reduced.

The color-changing temperature of the irreversible temperature indicator 41 can be selected according to the temperature rise at the time of the disconnection of the connection wire 34.

An example of a method of manufacturing the solar battery module 100 according to the first embodiment, which is configured as described above, is explained next. First, a plurality of solar battery cells 10 are manufactured by a known method. The solar battery string 20 is then manufactured by electrically connecting the solar battery cells 10 with the connection wire 34 in series.

Subsequently, the solar battery string 20 is arranged on the rear-surface side protecting member 32 via the sealing member 33. Thereafter, the light-receiving-surface side protecting member 31 is arranged on the solar battery string 20 via the sealing member 33 and these elements are then heated and pressed in vacuum, for example. With this operation, the members described above are laminated and integrated into one cell. The frame 36 and the output extraction units (the terminal box) 35 are then attached to the integrated cell.

Finally, on the surface (outer surface) of the non-light-receiving surface side of the rear-surface side protecting member 32, the irreversible temperature indicators 41 are arranged by, for example, coating the corresponding material in the areas corresponding to inter-cell areas where the connection wires 34 are arranged while being bent. With this operation, the solar battery module 100 according to the first embodiment is obtained. The order of the processes described above can be changed as appropriate unless a problem occurs particularly on the quality or the like.

As described above, in the solar battery module 100 according to the first embodiment, on the surface (outer surface) of the non-light-receiving surface side of the rear-surface side protecting member 32, the irreversible temperature indicators 41, which each change their color at a temperature of, for example, about 150° C., are arranged in the areas corresponding to inter-cell areas where the connection wires 34 are arranged while being bent. With this configuration, in the solar battery module 100, by confirming the change of the color of the irreversible temperature indicators 41, when there is a disconnection of a connection wire 34 arranged while being bent in the inter-cell area, it is possible to easily and surely confirm the location of the abnormality in the solar battery module 100 visually from outside. Furthermore, because the abnormality of the solar battery module 100 can be visually confirmed from outside, a burden on operations and costs is considerably reduced.

Second Embodiment

Figure 3A:
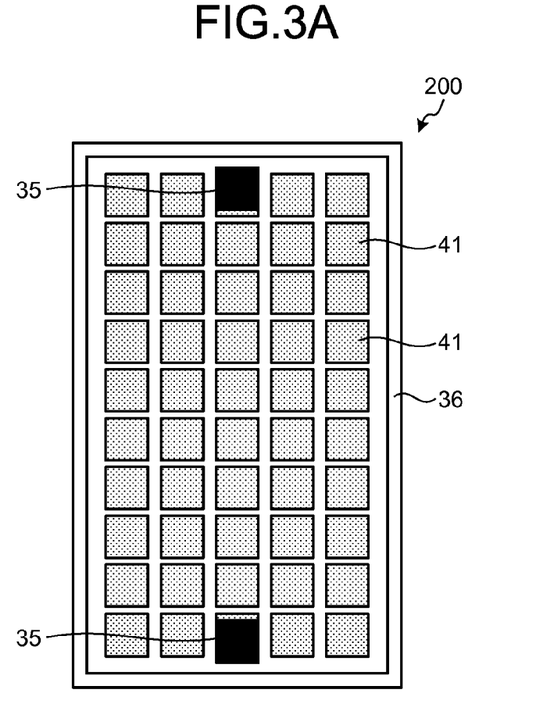
FIG. 3A is a plan view of a solar battery module according to a second embodiment of the present invention as viewed from a non-light-receiving surface side (a rear surface side)
Figure 3B:
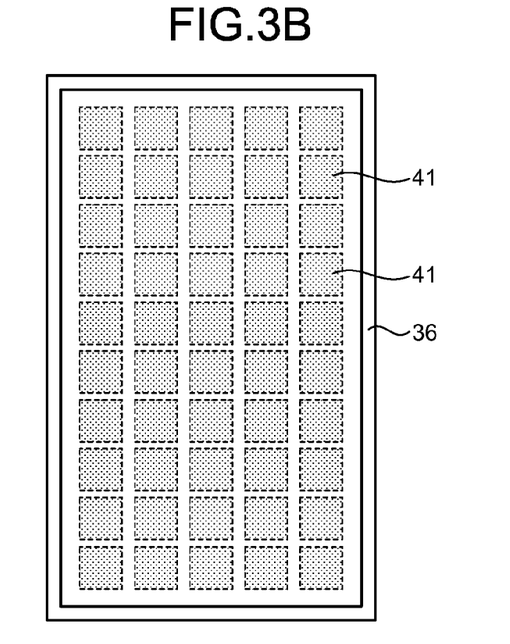
FIG. 3B is a perspective view of the solar battery module according to the second embodiment focused on positions of the irreversible temperature indicator and the solar battery cell as viewed from the non-light-receiving surface side (the rear surface side) through the rear-surface side protecting member.

FIG. 3A is a plan view of a solar battery module 200 according to a second embodiment of the present invention as viewed from a non-light-receiving surface side (a rear surface side). FIG. 3B is a perspective view of the solar battery module 200 according to the second embodiment focused on positions of the irreversible temperature indicators 41 and the solar battery cells 10 as viewed from the non-light-receiving surface side (the rear surface side) through the rear-surface side protecting member 32. The configuration of the solar battery module 200 according to the second embodiment is the same as that of the solar battery module 100 according to the first embodiment, except for an arrangement position of the irreversible temperature indicators 41 on the non-light-receiving surface side (the rear surface side).

In the solar battery module 200 according to the second embodiment, on the surface (outer surface) of the non-light-receiving surface side of the rear-surface side protecting member 32, the irreversible temperature indicators 41 that each change their color at a temperature of, for example, 150° C. are arranged in areas corresponding to the solar battery cells 10.

In the solar battery module 200, the connection wire 34 that electrically wire-bonds the light-receiving-surface bus electrode 52 of one solar battery cell 10 and the rear-surface bus electrode 62 of the other solar battery cell 10 is arranged between two adjacent solar battery cells 10 in the direction of connecting the solar battery cells 10 in series in the solar battery string 20. The rear-surface bus electrode 62 of the solar battery cell 10 and the connection wire 34 are electrically bonded to each other by soldering. Furthermore, the rear-surface bus electrode 62 of the solar battery cell 10 and the semiconductor substrate 7 are electrically bonded by the firing of the rear-surface bus electrode 62.

When the solar battery module 200 is used for a long time, a defect that the bonding is broken physically and electrically may occur in the bonding location of the connection wire 34 and the rear-surface bus electrode 62 and in the bonding location of the rear-surface bus electrode 62 and the semiconductor substrate 7 caused by a temporal degradation due to a temperature fluctuation. That is, because the solar battery module 200 is usually installed outdoors, the temperature of the solar battery module 200 is changed circularly, so that the connection wire 34 is constantly extended and shrunk repeatedly. This may cause a defect that the bonding is broken physically and electrically in at least one of the bonding location of the connection wire 34 and the rear-surface bus electrode 62 or the bonding location of the rear-surface bus electrode 62 and the semiconductor substrate 7.

The present inventor has found out that, based on his studies, when a defect occurs due to such a bonding defect, the resistance of the connection wire 34 is increased right before the occurrence of the defect, so that the temperature is increased up to about 150° C. due to heating of the connection wire 34. For example, when the connection wire 34 is made of copper, the temperature of the connection wire 34 is increased to about 150° C. due to the temperature rise at the time of a disconnection.

In the solar battery module 200, the irreversible temperature indicators 41 that change their color at a temperature of, for example, 150° C. are arranged in areas corresponding to the solar battery cells 10 on the surface (outer surface) of the non-light-receiving surface side of the rear-surface side protecting member 32. When there is a defect due to a bonding defect in at least one of the bonding location of the connection wire 34 and the rear-surface bus electrode 62 or the bonding location of the rear-surface bus electrode 62 and the semiconductor substrate 7, the temperature of the irreversible temperature indicator 41 is increased due to the temperature rise of the connection wire 34 at the time of the disconnection up to the color-changing temperature of the irreversible temperature indicator 41. When the irreversible temperature indicator 41 is made of, for example, copper, the temperature rises up to a temperature of about 150° C. and the color of the irreversible temperature indicator 41 changes. Therefore, in the solar battery module 200, by confirming the change of the color of the irreversible temperature indicator 41, when there is a bonding defect on the non-light-receiving surface side (the rear surface side) of the solar battery cell 10, it is possible to easily and surely confirm the location of the abnormality in the solar battery module 200 visually from outside. Furthermore, because the abnormality of the solar battery module 200 can be visually confirmed from outside, a burden on operations and costs is considerably reduced.

Third Embodiment

Figure 4A:
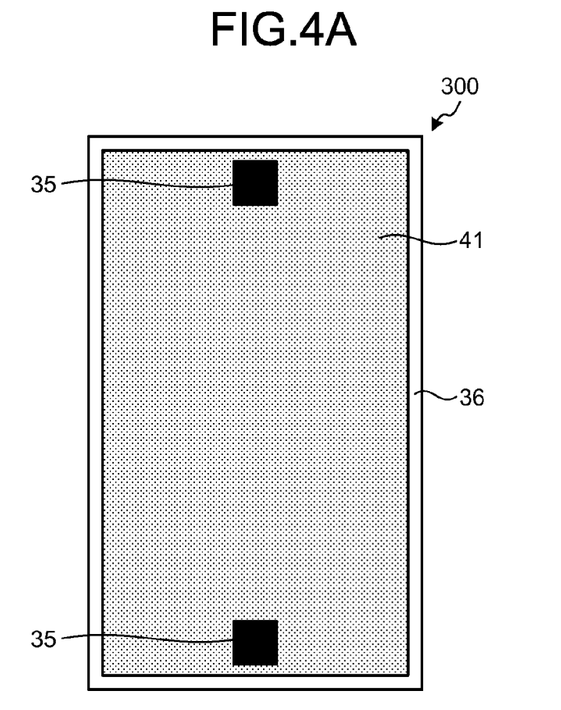
FIG. 4A is a plan view of a solar battery module according to a third embodiment of the present invention as viewed from a non-light-receiving surface side (a rear surface side)
Figure 4B:
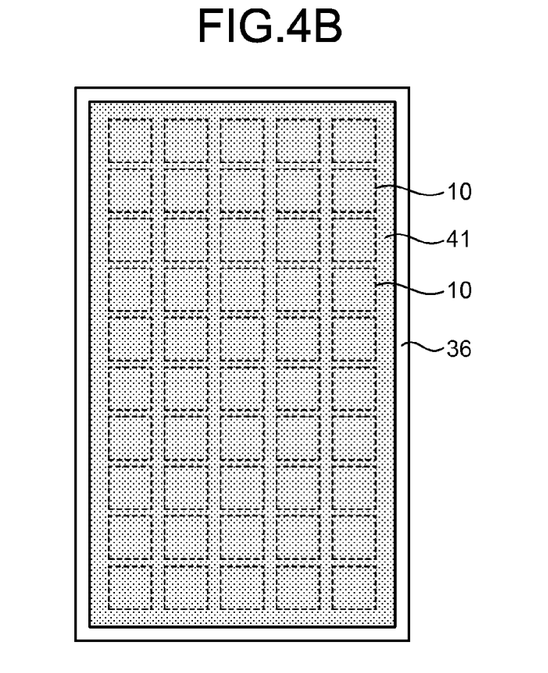
FIG. 4B is a perspective view of the solar battery module according to the third embodiment focused on positions of the irreversible temperature indicator and the solar battery cell as viewed from the non-light-receiving surface side (the rear surface side) through the rear-surface side protecting member.

FIG. 4A is a plan view of a solar battery module 300 according to a third embodiment of the present invention as viewed from a non-light-receiving surface side (a rear surface side). FIG. 4B is a perspective view of the solar battery module 300 according to the third embodiment focused on positions of the irreversible temperature indicators 41 and the solar battery cells 10 as viewed from the non-light-receiving surface side (the rear surface side) through the rear-surface side protecting member 32. The configuration of the solar battery module 300 according to the third embodiment is the same as that of the solar battery module 100 according to the first embodiment, except for an arrangement position of the irreversible temperature indicators 41 on the non-light-receiving surface side (the rear surface side).

In the solar battery module 300 according to the third embodiment, on the surface (outer surface) of the non-light-receiving surface side of the rear-surface side protecting member 32, the irreversible temperature indicator 41 that changes its color at a temperature of, for example, 150° C. is arranged on the entire surface. That is, the solar battery module 300 has a configuration that is obtained by combining the solar battery module 100 according to the first embodiment and the solar battery module 200 according to the second embodiment.

In the solar battery module 300 according to the third embodiment, the irreversible temperature indicator 41 that changes its color at a temperature of, for example, 150° C. is arranged in the area corresponding to inter-cell areas where the connection wires 34 are arranged while being bent on the surface (outer surface) of the non-light-receiving surface side of the rear-surface side protecting member 32. With this configuration, in the solar battery module 300 according to the third embodiment, by confirming the change of the color of the irreversible temperature indicator 41, it is possible to easily and surely confirm the location of the abnormality in the solar battery module 300 visually from outside when there is a disconnection of the connection wire 34 arranged while being bent in the inter-cell area.

Furthermore, in the solar battery module 300 according to the third embodiment, the irreversible temperature indicator 41 that changes its color at a temperature of, for example, 150° C. is arranged in the area corresponding to the solar battery cells 10 on the surface (outer surface) of the non-light-receiving surface side of the rear-surface side protecting member 32. With this configuration, in the solar battery module 300, by confirming the change of the color of the irreversible temperature indicator 41, it is possible to easily and surely confirm the location of the abnormality in the solar battery module 300 visually from outside when there is a bonding defect on the non-light-receiving surface side (the rear surface side) of the solar battery cell 10.

Fourth Embodiment

Figure 5:
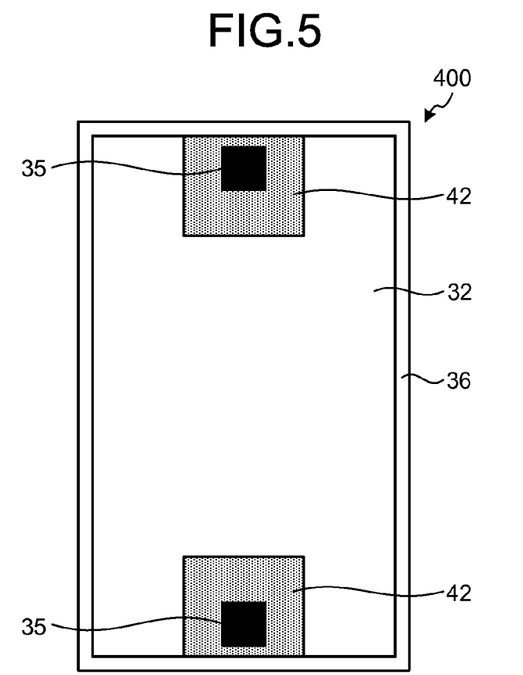
FIG. 5 is a plan view of a solar battery module according to a fourth embodiment of the present invention as viewed from a non-light-receiving surface side (a rear surface side)

FIG. 5 is a plan view of a solar battery module 400 according to a fourth embodiment of the present invention as viewed from a non-light-receiving surface side (a rear surface side). The configuration of the solar battery module 400 according to the fourth embodiment is the same as that of the solar battery module 100 according to the first embodiment, except for an arrangement position of an irreversible temperature indicator on the non-light-receiving surface side (the rear surface side).

In the solar battery module 400 according to the fourth embodiment, on the surface (outer surface) of the non-light-receiving surface side of the rear-surface side protecting member 32, irreversible temperature indicators 42 that each change their color at a temperature of, for example, 100° C. are arranged in circumferential areas of the output extraction units 35, respectively.

As described above, a bypass diode is provided in the output extraction unit 35. The bypass diode is a component for bypassing, when only a part of the solar battery modules 100 is disabled to generate power temporarily due to shading of a cloud, a tree, or the like, the solar battery module 100 that is disabled to generate power only for a period of being disabled to generate the power so that a current flows to the other solar battery module 100. Therefore, when the solar battery module 100 is operated normally, the current does not flow through the bypass diode. That is, normally, the current flows through the bypass diode only intermittently.

However, when there is an abnormality in the solar battery module 400 due to a defect caused by a disconnection or a bonding defect as described in the first and second embodiments, a current continuously flows through the bypass diode in the solar battery module 400.

The present inventor has found out that, based on his studies, when a current continuously flows through a bypass diode as described above, the bypass diode is heated, so that the temperature is increased up to about 100° C.

In this connection, in the solar battery module 400, on the surface (outer surface) of the non-light-receiving surface side of the rear-surface side protecting member 32, the irreversible temperature indicators 42 that each change their color at a temperature of, for example, 100° C. are arranged in the circumferential areas of the output extraction units 35. When the current continuously flows through a bypass diode so that the bypass diode is broken, the temperature of the irreversible temperature indicator 42 is increased due to the temperature rise of the bypass diode up to the color-changing temperature of the irreversible temperature indicator 42, for example, a temperature of about 100° C., which changes the color of the irreversible temperature indicator 42.

With this configuration, in the solar battery module 400, by confirming the changes of the color of the irreversible temperature indicators 42, it is possible to easily and surely confirm that the bypass diode is broken visually from outside. Thus, it is easy and sure to confirm that a defect has occurred due to a disconnection of the connection wire 34 or a bonding defect on the non-light-receiving surface side (the rear surface side) of the solar battery cell 10 in the solar battery module 400 visually from outside. Furthermore, because the abnormality of the solar battery module 400 can be visually confirmed from outside, a burden on operations and costs is considerably reduced.

Fifth Embodiment

Figure 6:
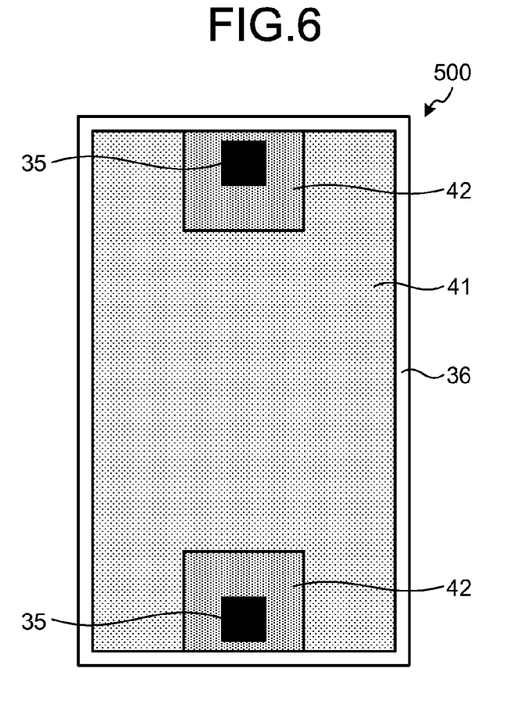
FIG. 6 is a plan view of a solar battery module according to a fifth embodiment of the present invention as viewed from a non-light-receiving surface side (a rear surface side).

FIG. 6 is a plan view of a solar battery module 500 according to a fifth embodiment of the present invention as viewed from a non-light-receiving surface side (a rear surface side). The configuration of the solar battery module 500 according to the fifth embodiment is the same as that of the solar battery module 100 according to the first embodiment, except for an arrangement position of the irreversible temperature indicator on the non-light-receiving surface side (the rear surface side).

In the solar battery module 500 according to the fifth embodiment, on the surface (outer surface) of the non-light-receiving surface side of the rear-surface side protecting member 32, the irreversible temperature indicators 42 that each change their color at a temperature of, for example, 100° C. are arranged in the circumferential areas of the output extraction units 35. Furthermore, on the surface (outer surface) of the non-light-receiving surface side of the rear-surface side protecting member 32, the irreversible temperature indicator 41, which changes its color at a temperature of, for example, about 150° C., is arranged on the entire surface, except for the circumferential areas of the output extraction unit 35, that is, on the entire surface of an area where the irreversible temperature indicators 42 that each change their color at a temperature of 100° C. are not arranged. Therefore, the solar battery module 500 has a configuration obtained by combining the solar battery module 300 according to the third embodiment and the solar battery module 400 according to the fourth embodiment.

In the solar battery module 500 according to the fifth embodiment configured as described above, the irreversible temperature indicator 41 that changes its color at a temperature of, for example, 150° C. is arranged in the area corresponding to inter-cell areas where the connection wires 34 are arranged while being bent on the surface (outer surface) of the non-light-receiving surface side of the rear-surface side protecting member 32. With this configuration, in the solar battery module 500, by confirming the change of the color of the irreversible temperature indicator 41, it is easy and sure to confirm the location of the abnormality in the solar battery module 500 visually from outside when there is a disconnection of the connection wire 34 that is arranged while being bent in the inter-cell area.

Furthermore, in the solar battery module 500 according to the fifth embodiment, the irreversible temperature indicator 41 that changes its color at a temperature of, for example, 150° C. is arranged in the area corresponding to the solar battery cells 10 on the surface (outer surface) of the non-light-receiving surface side of the rear-surface side protecting member 32. With this configuration, in the solar battery module 500, by confirming the change of the color of the irreversible temperature indicator 41, it is possible to easily and surely confirm the location of the abnormality in the solar battery module 500 visually from outside when there is a bonding defect on the non-light-receiving surface side (the rear surface side) of the solar battery cell 10.

In the solar battery module 500 according to the fifth embodiment, the irreversible temperature indicators 42 that change their color at a temperature of, for example, 100° C. are arranged in the circumferential areas of the output extraction units 35 on the surface of the non-light-receiving surface side of the rear-surface side protecting member 32. With this configuration, in the solar battery module 500, by confirming the change of the color of the irreversible temperature indicators 42, it is easy and sure to confirm that a bypass diode is broken visually from outside, and thus it is possible to easily and surely confirm that a defect has occurred due to a disconnection of the connection wire 34 or a bonding defect on the non-light-receiving surface side (the rear surface side) of the solar battery cell 10 in the solar battery module 500 visually from outside.

Furthermore, by constituting a solar power generation system by electrically connecting a plurality of solar battery modules of the same type as the solar battery module according to the above embodiments in series or in parallel, it is easy and sure to confirm that a solar battery module having an abnormality and the location of the abnormality in the solar battery module visually from outside.

According to the present invention, it is possible to confirm generation of an abnormality in a solar battery module easily and inexpensively.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A solar battery module comprising:
a plurality of solar batter cells arranged on a same plane with a predetermined gap area;
a light-receiving-surface side protecting member and a rear-surface side protecting member sandwiching the solar battery cells therebetween; and
an irreversible temperature indicator that is provided on an outer surface of a non-light-receiving surface side of the rear-surface side protecting member, wherein
the irreversible temperature indicator changes its color when a temperature rises to a predetermined color-changing temperature and maintains a color-changed status even when the temperature is decreased from the color-changing temperature to indicate a temperature rise to the predetermined color-changing temperature.

2. The solar battery module according to claim 1, wherein
a first connection electrode on a light receiving surface side of one solar battery cell among two adjacent solar battery cells adjacent to each other via the gap area and a second connection electrode on the non-light-receiving surface side of the other solar battery cell are electrically connected to each other across the gap area using an electrically-conductive connection wire that is bent in the gap area, and
the irreversible temperature indicator is arranged in an area corresponding to the gap area in a plane direction of the rear-surface side protecting member on the outer surface of the non-light-receiving surface side of the rear-surface side protecting member.

3. The solar battery module according to claim 2, wherein
the connection wire is made of copper, and
the color-changing temperature of the irreversible temperature indicator is 150° C.

4. The solar battery module according to claim 1, wherein the irreversible temperature indicator is arranged in an area corresponding to the solar battery cell in a plane direction of the rear-surface side protecting member on the outer surface of the non-light-receiving surface side of the rear-surface side protecting member.

5. The solar battery module according to claim 4, wherein
the solar battery cell is a silicon-crystal solar battery,
each of the connection electrodes is a fired electrode of a fired electrode material including silver and glass, and
the color-changing temperature of the irreversible temperature indicator is 150° C.

6. The solar battery module according to claim 1, further comprising an output extraction unit that is provided on the outer surface of the non-light-receiving surface side of the rear-surface side protecting member and extracts an output of the solar battery module, wherein
the irreversible temperature indicator is arranged in a circumferential area of the output extraction unit on the outer surface of the non-light-receiving surface side of the rear-surface side protecting member.

7. The solar battery module according to claim 6, wherein
the output extraction unit includes a bypass diode, and
the color-changing temperature of the irreversible temperature indicator is 100° C.

8. A solar power generation system wherein at least two of the solar battery modules according to claim 1 are electrically connected in series or in parallel.

* * * * *